US006902764B2

(12) United States Patent
Ljungberg et al.

(10) Patent No.: US 6,902,764 B2
(45) Date of Patent: Jun. 7, 2005

(54) OXIDE COATED CUTTING TOOL

(75) Inventors: Björn Ljungberg, Enskede (SE); Lars-Anders Budzynski, Huddinge (SE)

(73) Assignee: Sandvik Aktiebolag, Sandviken (SE)

(*) Notice: Subject to any disclaimer, the term of this patent is extended or adjusted under 35 U.S.C. 154(b) by 0 days.

(21) Appl. No.: 10/757,401

(22) Filed: Jan. 15, 2004

(65) Prior Publication Data

US 2004/0144302 A1 Jul. 29, 2004

Related U.S. Application Data

(62) Division of application No. 09/985,407, filed on Nov. 2, 2001, now Pat. No. 6,713,172.

(30) Foreign Application Priority Data

Nov. 22, 2000 (SE) ............................................ 0004272

(51) Int. Cl.[7] ............................................ C23C 16/40

(52) U.S. Cl. ........................... 427/255.31; 427/255.34; 427/255.7; 427/255.36

(58) Field of Search ....................... 427/255.31, 255.34, 427/255.36, 255.7

(56) References Cited

U.S. PATENT DOCUMENTS

| | | | | |
|---|---|---|---|---|
| 4,984,940 A | * | 1/1991 | Bryant et al. | 407/119 |
| 5,487,625 A | * | 1/1996 | Ljungberg et al. | 407/119 |
| 5,589,223 A | | 12/1996 | Odani et al. | |
| 5,674,564 A | | 10/1997 | Ljungberg et al. | |
| 5,766,782 A | * | 6/1998 | Ljungberg | 428/698 |
| 5,827,570 A | | 10/1998 | Russell | |
| 5,834,061 A | * | 11/1998 | Ljungberg | 427/255.34 |
| 5,851,687 A | * | 12/1998 | Ljungberg | 428/689 |
| 5,861,210 A | | 1/1999 | Lenander et al. | |
| 5,912,051 A | | 6/1999 | Olsson et al. | |
| 6,293,739 B1 | | 9/2001 | Uchino et al. | |
| 6,333,103 B1 | | 12/2001 | Ishii et al. | |
| 6,337,152 B1 | | 1/2002 | Kukino et al. | |

FOREIGN PATENT DOCUMENTS

| | | |
|---|---|---|
| EP | 0 753 602 A | 1/1997 |
| EP | 0 784 103 A1 | 7/1997 |
| WO | 95 19457 A | 7/1995 |

OTHER PUBLICATIONS

S. Ruppi et al., "*Microstructure and deposition characteristics of κ–$Al_2O_3$*", *J. Phys. IV France,* 9 (1999), pp. 349–355.

U.S. Appl. No. 10/155,168, Björn Ljungberg, "Oxide Coated Cutting Tool", filed May 28, 2002.

* cited by examiner

*Primary Examiner*—Timothy Meeks
(74) *Attorney, Agent, or Firm*—Burns, Doane, Swecker & Mathis, L.L.P.

(57) ABSTRACT

According to the present invention there is provided a body at least partially coated with one or more refractory layers of which at least one layer essentially consist of α-$Al_2O_3$. Said α-$Al_2O_3$ layer consists of essentially equiaxed grains with an average grain size of <1 μm and with a bimodal grain size distribution with coarser grains with an average grainsize in the interval 0.5–1 μm and finer grains with an average grainsize of <0.5 μm. The $Al_2O_3$ layer further contains striated zones containing titanium (>5 at %) but no nitrogen or carbon. This particular microstructure is obtained by temporarily stopping the gases needed for the growth of the $Al_2O_3$ layer and introducing $TiCl_4$.

4 Claims, 2 Drawing Sheets zones

6 μm $Al_2O_3$

TiCN (invention)

Figure 3A:
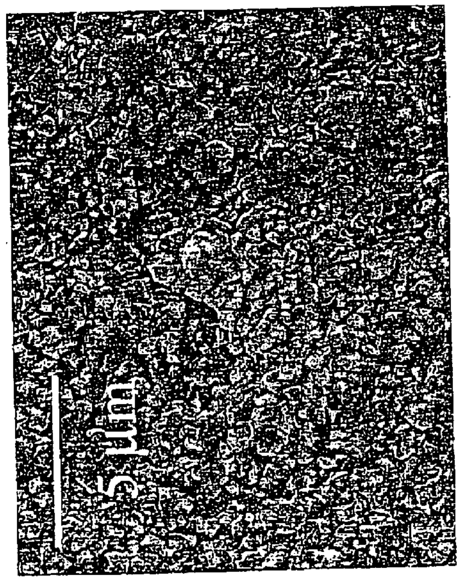

5 μm
Fig. 2a (prior art)
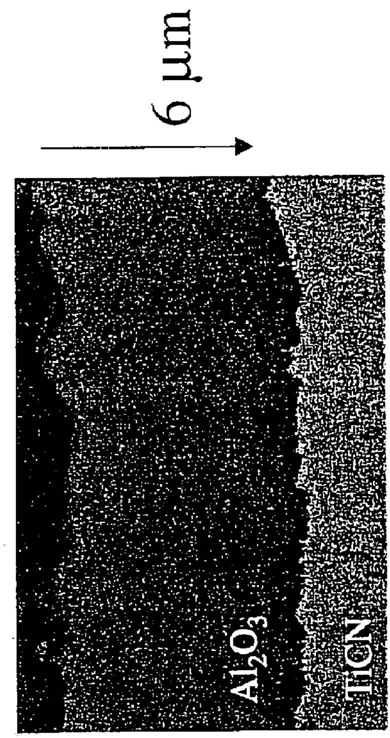
Fig. 2b (prior art)
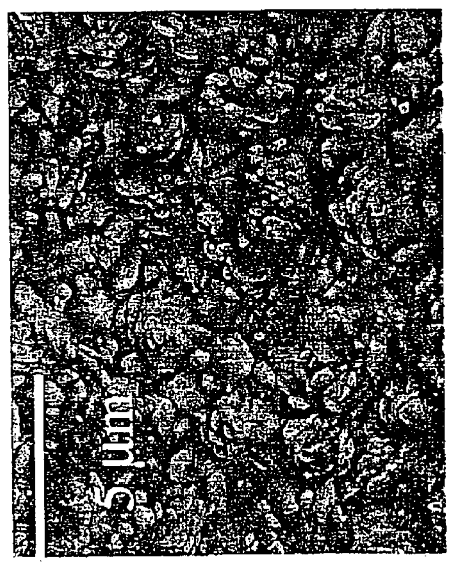
Fig. 1a (invention)
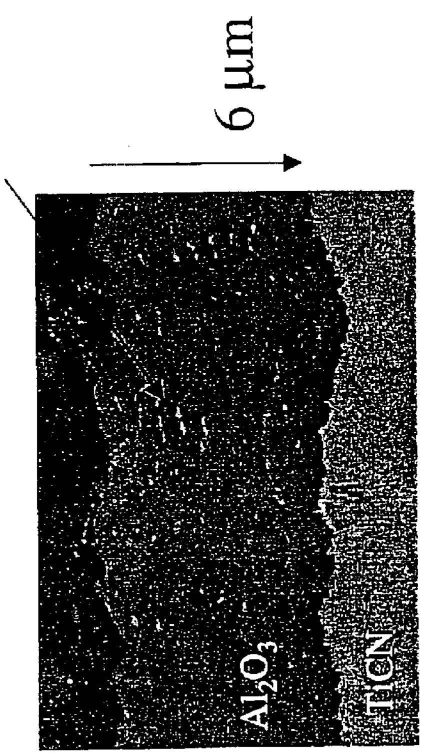
Fig. 1b (invention)

OXIDE COATED CUTTING TOOL

CROSS-REFERENCE TO RELATED APPLICATIONS

This application is a divisional of U.S. patent application Ser. No. 09/985,407 filed on Nov. 2, 2001 now U.S. Pat. No. 6,713,172, the entire contents of which are herein incorporated by reference, and claims priority under 35 U.S.C. §§119 and/or 365 to application number 0004272-1 filed in Sweden on Nov. 22, 2003, the entire contents of which are herein incorporated by reference.

FIELD OF THE INVENTION

The present invention relates to a coated cutting tool for chipforming machining. The coating includes at least one alumina ($Al_2O_3$) layer characterized by fine, equiaxed grains.

DESCRIPTION OF THE RELATED ART

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Cemented carbide cutting tools can be coated with various types of $Al_2O_3$ layers by using Chemical Vapour Deposition (CVD), e.g., pure $\kappa$-$Al_2O_3$, mixtures of $\kappa$- and $\alpha$-$Al_2O_3$, coarse grained $\alpha$-$Al_2O_3$, and fine grained textured $\alpha$-$Al_2O_3$ have been commercially available for years generally in multilayer combinations with other metal carbide and/or nitride layers, the metal being selected from transition metals of the IVB, VB and VIB groups of the Periodic Table.

$Al_2O_3$ crystalizes in several different phases: $\alpha$, $\kappa$, $\gamma$, $\delta$, $\theta$ etc. The two most frequently occurring phases of CVD-produced wear resistant $Al_2O_3$ layers are the thermodynamically stable $\alpha$-phase and the metastable $\kappa$-phase, or a mixture thereof. Generally, the $\kappa$-phase exhibits a grainsize in the range 0.5–3.0 $\mu$m and the grains predominately grow through the whole coating forming a columnar type coating morphology. Furthermore, the $\kappa$-$Al_2O_3$ layers are free from crystallographic defects and also free from micropores and voids.

Coarse-grained (3–6 $\mu$m) $\alpha$-$Al_2O_3$ often possesses porosity and crystallographic defects, while fine-grained textured $\alpha$-$Al_2O_3$ are free of defects with very pronounced columnar-shaped grains.

In U.S. Pat. No. 5,674,564 is disclosed a method of growing a fine-grained $\kappa$-alumina layer by employing a low deposition temperature and a high concentration of a sulphur dopant.

In U.S. Pat. No. 5,487,625 a method is disclosed for obtaining a fine grained, (012)-textured $\alpha$-$Al_2O_3$ layer consisting of columnar grains with a small cross section (about 1 $\mu$m).

In U.S. Pat. No. 5,766,782 a method is disclosed for obtaining a fine-grained (104)-textured $\alpha$-$Al_2O_3$ layer.

As mentioned above, all $Al_2O_3$ layers produced by the CVD technique possess a more or less columnar-like grainstructure. An $Al_2O_3$ layer with an equiaxed grainstructure is, however, expected to show some favorable mechanical properties, e.g.—resistance to crack propagation, as compared to a layer with a columnar grainstructure. One well-known and possible technique to avoid columnar grain growth is to deposit a so-called multilayer structure in which the columnar growth of $Al_2O_3$ is periodically interrupted by the growth of a thin, 0.1–1 $\mu$m second layer such as disclosed in U.S. Pat. No. 4,984,940. The second layer should preferably have a different crystal structure or at least different lattice spacings in order to be able to initiate renucleation of the first layer. One example of such a technique is when the $Al_2O_3$ growth periodically is interrupted by a short TiN deposition process resulting in a ($Al_2O_3$+TiN)xn multilayer structure with a thickness of the individual TiN layers of about 0.1–1 $\mu$m (see, e.g.—Proceedings of the 12th European CVD Conference, page pr. 8–349). However such multilayer structures very often suffer from a low adherence between the two different types of layers.

SUMMARY OF THE INVENTION

It is the object of the present invention to provide onto a hard substrate, or preferably onto a hard substrate coated with a $TiC_xN_yO_z$ layer, at least one single phase $\alpha$-$Al_2O_3$ layer with a microstructure which is different from the prior art columnar $\alpha$- or $\kappa$-$Al_2O_3$ CVD layers mentioned above. It is also the object of the present invention to provide a high performance tool coating comprising the invented $Al_2O_3$ layer.

It is a further object of the invention to provide an alumina coated cutting tool insert with improved cutting performance in steel, stainless steel, cast iron and in particular nodular cast iron.

According to one aspect, the present invention provides a cutting tool comprising a body of sintered cemented carbide, cermet, or ceramic superhard material, the body comprising a surface, and a hard and wear resistant coating on at least a portion of the surface, said coating comprising: one or more refractory layers of which at least one layer essentially consists of $\alpha$-$Al_2O_3$, said $\alpha$-$Al_2O_3$ layer having equiaxed grains with an average grainsize of <1 $\mu$m and further containing striated zones containing >5 at % titanium, but no nitrogen or carbon.

According to another aspect, the present invention provides a method of coating a body with an $\alpha$-alumina layer comprising: (i) bringing the body into contact with a hydrogen carrier gas containing one or more halides of aluminium and a hydrolysing and/or oxidizing agent while the body is at a temperature of 950–1000° C.; (ii) maintaining the oxidation potential of the CVD-reactor atmosphere prior to the nucleation of $Al_2O_3$ at a low level, using a total predetermined concentration of oxidizing species; (iii) starting $Al_2O_3$ growth by introducing the following gases into the reaction chamber: $AlCl_3$, HCl and $CO_2$; (iv) adding a sulphur dopant after 20–60 min; (v) repeatedly stopping the $CO_2$, $AlCl_3$, HCl and the sulphur dopant for intervals of 10–50 min during which $TiCl_4$ is allowed to enter the reactor for 1–10 min in a concentration of 1–10%; and (vi) then reintroducing $AlCl_3$, HCl, $CO_2$ and the sulphur dopant, in that order.

BRIEF DESCRIPTION OF THE DRAWING FIGURES

FIG. 1*a* is a Scanning Electron Microscope (SEM) micrograph of an $Al_2O_3$ layer according to the present invention.

FIG. 1*b* is a SEM micrograph at high magnification of a polished cross-section of an $Al_2O_3$ layer according to the present invention.

FIG. 2*a* is a SEM micrograph prior art $Al_2O_3$ layer.

FIG. 2*b* is a SEM micrograph at high magnification of a polished cross-section of an $Al_2O_3$ layer according to the prior art.

FIG. 3*a* is a SEM micrograph of a prior art multilayer $Al_2O_3$/TiN coating.

Figure 3B:
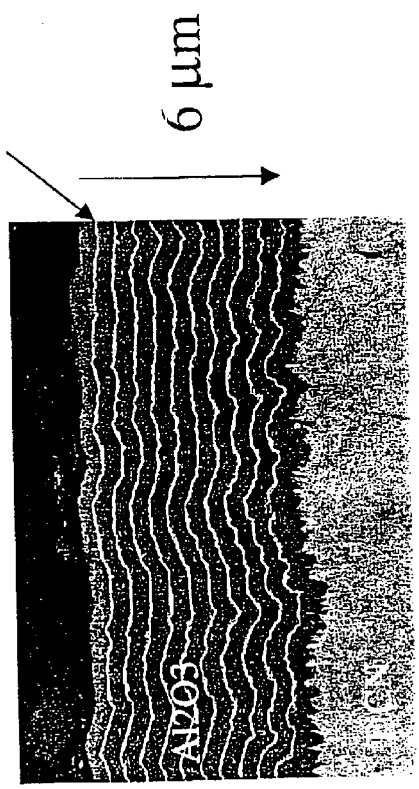

FIG. 3*b* is a SEM micrograph at high magnification of a polished cross-section of an $Al_2O_3$/TiN multilayer according to the prior art.

DETAILED DESCRIPTION OF THE INVENTION

Surprisingly it has been found that a non-columnar α-$Al_2O_3$ layer can be deposited by interrupting the $Al_2O_3$ growth process by obstructing the flow of the $CO_2$, $AlCl_3$, HCl and $H_2S$ gases to the reactor chamber and then immediately introducing $TiCl_4$ ($H_2$ is already present in the reactor) for a short period of time. When the reactant gases $AlCl_3$, HCl, $CO_2$ and $H_2S$ are allowed to reenter the reactor again in that mentioned order, renucleation of $Al_2O_3$ will take place. The duration of the $TiCl_4$ treatment as well as the $TiCl_4$ concentration are important parameters which must be optimized in order to obtain the desired result. If the $TiCl_4$ concentration is too low and/or treatment time is too short, the renucleation of the $Al_2O_3$ layer will not be sufficiently dense to cover a sufficient portion of the whole coating surface. If, on the other hand, the $TiCl_4$ concentration is too high and/or the treatment time is too long, the cohesion between the $Al_2O_3$ grains will be too weak resulting in a low quality coating.

The method of the present invention thus relates to the coating of a body with an α-alumina layer during which the body is brought in contact with a hydrogen carrier gas containing one or more halides of aluminium and a hydrolysing and/or oxidizing agent at temperature of the body between 950 and 1000° C. The oxidation potential of the CVD-reactor atmosphere prior to the nucleation of $Al_2O_3$ is kept at a low level keeping the total concentration of $H_2O$, water vapor, or other oxidizing species, preferably less than 5 ppm. The $Al_2O_3$ growth is started by sequencing the following gases $AlCl_3$, HCl and $CO_2$ ($H_2$ is already present in the reactor) into the reaction chamber in that mentioned order or by using the start-up procedures described in any of the prior art patents, U.S. Pat. Nos. 5,487,625 and 5,766,782, in order to achieve different textures of the $Al_2O_3$ layer. After 10–60 minutes a sulphur dopant, preferably $H_2S$ is added to the gas mixture. The flow of the $CO_2$, $AlCl_3$, HCl gases and the sulphur dopant are periodically interrupted at intervals of 10–50 minutes and 1–10% (of the hydrogen flow) $TiCl_4$ is allowed to enter the reactor for a period of 1–10 minutes and then again replaced by $AlCl_3$, HCl, $CO_2$ and the sulphur dopant in that mentioned order. This procedure is repeatedly carried out in order to obtain a striated, bimodal α-$Al_2O_3$ layer structure with the desired grainsize and texture.

In contrast to the columnar grains of prior art $Al_2O_3$ layers, the grains of the $Al_2O_3$ layers according to the present invention are essentially equiaxed with a bimodal structure which is a mixture of small and large grains. The obtained grainsize and the distribution of the same are dependent on the number of $TiCl_4$ treatments carried out. The more frequently the $Al_2O_3$ process is interrupted and the $Al_2O_3$ surface is treated with $TiCl_4$, the smaller the $Al_2O_3$ grains will be. The large $Al_2O_3$ grains have an average grain size $d_c<1$ μm and the small $Al_2O_3$ grains, $0.1 \leqq d_f \leqq 1/3\ d_c$.

The grainsize in the α-$Al_2O_3$ layer can be determined from a SEM top-view micrograph at about 4000× magnification. Such a micrograph of an $Al_2O_3$ layer surface according to the present invention is shown in FIG. 1*a*. In FIGS. 2*a* and 3*a*, the micrographs of prior art $Al_2O_3$ layers are shown. The size and the shape of the grains can easily be observed. Furthermore, the striated zones in the α-$Al_2O_3$ layer which contain titanium and oxygen are visible in a polished cross section at 4000–6000× magnification. These striated zones which do not contain any carbon or nitrogen may also contain some aluminium. The striated zones are preferably <0.2 μm thick and the number of striated zones per μm $Al_2O_3$ layer should be 1–10. The zones may be closely linked together but in some cases almost resembling a multilayer structure. The presence of these striated zones in the $Al_2O_3$ structure evidently limits the $Al_2O_3$ grain-growth and makes renucleation possible without the negative effect of fully intermediate or intervening layers.

By selecting appropriate conditions for the initial growth of the $Al_2O_3$ layer, e.g.—according to the procedures in patents U.S. Pat. Nos. 5,487,625 and 5,766,782, $Al_2O_3$ layers textured in the (012)-, (024)- or (104)-directions with a texture coefficient TC>1.3 can be deposited.

The texture Coefficient, TC, is defined as:

$$TC(hkl) = \frac{I(hkl)}{I_o(hkl)}\left\{\frac{1}{n}\sum\frac{I(hkl)}{I_o(hkl)}\right\}^{-1}$$

where

I(hkl)=measured intensity of the (hkl) reflection $I_o$(hkl)=standard intensity of the ASTM standard powder pattern diffraction data n=number of reflections used in the calculation, (hkl) reflections used are: (012), (104), (110), (113), (024), (116)

The coated body may comprise a cutting tool with a substrate of cemented carbide, cermet or a ceramic superhard material and a coating consisting of a hard wear resistant material and in said coating at least one layer is a single phase α-$Al_2O_3$ layer according to the present invention, and said single phase α-$Al_2O_3$ layer having a thickness in the range 0.5–25 μm. The other layers in the coating structure may be TiC or related carbide, nitride, carbonitride, oxycarbide and oxycarbonitride of a metal selected from the Groups IVB, VB, and VIB of the Periodic Table, the elements B, Al and Si and/or mixtures thereof. Such other layers may be deposited by CVD, PACVD (Plasma CVD), PVD (Physical Vapour Deposition) or MT-CVD (Moderate Temperature CVD). At least one of such other layers is in contact with the substrate. The total thickness of the coating of the cutting tool can vary between 1 and 30 μm.

EXAMPLE

A) Cemented carbide cutting inserts in style CNMG 120412-KM with the composition 6 weight-% Co and balance WC were coated with a 5 μm thick layer of Ti(C,N) using the MTCVD-technique with $TiCl_4$, $H_2$, $N_2$ and $CH_3CN$ as process gases. In subsequent process steps during the same coating cycle, a 0.5 μm $TiC_xN_yO_z$ layer with an approximate composition corresponding to x=0.5, y=0.3 and z=0.2 was deposited followed by a 6 μm thick layer of α-$Al_2O_3$ deposited according to the invented coating process. Prior to the nucleation of the $Al_2O_3$ the oxidation potential of the carrier gas $H_2$ (only gas present in the reactor) i.e. the water vapor concentration, was explicitly set to a low level, i.e.—less than 5 ppm.

Then the first $Al_2O_3$ layer step 1 was started up. The process conditions during the $Al_2O_3$ deposition were as below:

| | Step | | | |
|---|---|---|---|---|
| | 1 | 2 | 3 | 4 |
| CO2: | 4% | 4% | 0% | 4% |
| AlCl3: | 4% | 4% | 0% | 4% |
| H2S | — | 0.2% | 0% | 0.2% |
| HCl | 1.5% | 5% | 0% | 5% |
| H2: | balance | balance | balance | balance |
| TiCl4 | — | — | 5% | |
| Pressure: | 60 mbar | 60 mbar | 60 mbar | 60 mbar |
| Temperature: | 1000° C. | 1000° C. | 1000° C. | 1000° C. |
| Duration: | 30 min | 20 min | 5 min | 20 min |

The $Al_2O_3$ layer was deposited by proceeding through step 1, 2 and 3 and then looping between step 3 and step 2 nine times and finishing the process by step 4. Hence, the $Al_2O_3$-process was interrupted and treated with $TiCl_4/H_2$ altogether ten times.

XRD-analysis of the deposited $\alpha$-$Al_2O_3$ showed a strongly textured structure with a texture coefficient TC(012) of 1.7 of the (012) planes and TC(024) of 1.5 of the (024) planes.

From the SEM-micrographs taken from the top surface, similar to FIG. 1*a*, the grainsize was determined. The coarse grains had an average grainsize of 0.9 $\mu$m and the fine grains had an average grainsize of 0.3 $\mu$m.

B) The cemented carbide substrate of A) was coated with Ti(C,N) (5 $\mu$m), a 0.5 $\mu$m $TiC_xN_yO_z$ layer and $Al_2O_3$ (6 $\mu$m) as set forth in A) except for that the $Al_2O_3$ process was carried out according to prior art technique, i.e.—the same process as described under A.) except for that the $TiCl_4/H_2$-treatments were excluded and an $Al_2O_3$ process time of 290 min. This resulted in an $Al_2O_3$ layer consisting essentially of the $\kappa$-$Al_2O_3$ phase with an average grainsize of about 2 $\mu$m, FIG. 2*a*.

C) The cemented carbide substrate of A) was coated with Ti(C,N) (5 $\mu$m), a 0.5 $\mu$m $TiC_xN_yO_z$ layer and a 6 $\mu$m of multilayered $Al_2O_3$ coating on top as set forth in A) except for that step 3 was substituted by a prior art TiN-process step. The process parameters for this TiN-step were as follow: 2% $TiCl_4$, 40% $N_2$, 58% $H_2$ and a process time of 3 min. This resulted in a multilayer coating consisting of 11 layers of $Al_2O_3$ and 10 thin layers of TiN. The $Al_2O_3$ layer was determined to consist of the $\kappa$-phase.

Coated tool inserts from A), B) and C) were all wet blasted with 150 mesh $Al_2O_3$ powder in order to smooth the coating surfaces.

The cutting inserts were then tested with respect to edge line and rake face flaking in a facing operation in nodular cast iron. The shape of the machined work piece was such that the cutting edge is intermitted twice during each revolution.

Cutting data:

Speed=170 m/min,

Cutting depth=2.0 mm and

Feed=0.1 mm/rev.

The inserts were run one cut over the face of the work piece. This test is very decisive and demanding when cutting nodular cast iron. The percentage of the edge line in cut that obtained flaking into the carbide substrate was recorded for each insert tested as well as to what extent flaking occurred on the rake phase of the cutting insert.

The results are expressed in the table below as an average value of the four inserts.

| | Flaking | |
|---|---|---|
| | Edge line | Rake face |
| A) $\alpha$-$Al_2O_3$ single phase/striated (acc. to invention) | 0% | only spot-wise flaking of the $Al_2O_3$ layer |
| B) $\kappa$-$Al_2O_3$ (prior art) | 90% | severe $Al_2O_3$-Flaking |
| C) multilayer $Al_2O_3$/TiN (prior art) | 70% | Flaking between TiN and $Al_2O_3$ layers |

While the present invention has been described by reference to the above-mentioned embodiments, certain modifications and variations will be evident to those of ordinary skill in the art. Therefore, the present invention is to limited only by the scope and spirit of the appended claims.

What is claimed is:

1. A method of coating a body with an $\alpha$-alumina layer comprising:

(i) bringing the body into contact with a hydrogen carrier gas containing one or more halides of aluminium and a hydrolysing and/or oxidizing agent while the body is at a temperature of 950–1000° C.;

(ii) maintaining the oxidation potential of the CVD-reactor atmosphere prior to the nucleation of $Al_2O_3$ at a low level, using a total predetermined concentration of oxidizing species;

(iii) starting $Al_2O_3$ growth by introducing the following gases into the reaction chamber: $AlCl_3$, HCl and $CO_2$;

(iv) adding a sulphur dopant after 20–60 min;

(v) repeatedly stopping the $CO_2$, $AlCl_3$, HCl and the sulphur dopant for intervals of 10–50 min during which $TiCl_4$ is allowed to enter the reactor for 1–10 min in a concentration of 1–10%; and (vi) then reintroducing $AlCl_3$, HCl, $CO_2$ and the sulphur dopant, in that order.

2. The method of claim 1, wherein in step (ii), the concentration of the oxidizing species is below 5 ppm.

3. The method of claim 2, wherein the oxidizing species comprises $H_2O$.

4. The method of claim 1, wherein the sulphur dopant comprises $H_2S$.

* * * * *